United States Patent
Sakai et al.

(10) Patent No.: US 7,445,809 B2
(45) Date of Patent: Nov. 4, 2008

(54) METHOD OF FORMING GATE WIRING PATTERN BY DROPLET DISCHARGE

(75) Inventors: Shinri Sakai, Suwa (JP); Toshimitsu Hirai, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/561,548

(22) Filed: Nov. 20, 2006

(65) Prior Publication Data

US 2007/0116877 A1 May 24, 2007

Related U.S. Application Data

(62) Division of application No. 11/235,708, filed on Sep. 26, 2005, now Pat. No. 7,303,780.

(30) Foreign Application Priority Data

Oct. 21, 2004 (JP) .............................. 2004-306602

(51) Int. Cl.
*H05K 3/10* (2006.01)
*B05D 3/12* (2006.01)

(52) U.S. Cl. ..................................... 427/98.4; 427/256
(58) Field of Classification Search .................. None
See application file for complete search history.

(56) References Cited

U.S. PATENT DOCUMENTS

| | | | |
|---|---|---|---|
| 5,670,205 A * | 9/1997 | Miyazaki et al. .............. 427/64 |
| 6,810,814 B2 | 11/2004 | Hasei | |
| 6,872,586 B2 * | 3/2005 | Kiguchi et al. ................ 438/28 |
| 7,146,910 B2 | 12/2006 | Hasei | |
| 7,156,515 B2 | 1/2007 | Iwata | |
| 2003/0198789 A1 * | 10/2003 | Koyama et al. .......... 428/195.1 |
| 2004/0261701 A1 | 12/2004 | Kobayashi et al. | |
| 2005/0276912 A1 * | 12/2005 | Yamamoto et al. .......... 427/117 |

FOREIGN PATENT DOCUMENTS

| | | |
|---|---|---|
| JP | 2003-316279 | 11/2003 |
| JP | 2003-317945 | 11/2003 |
| JP | 2004-000927 | 1/2004 |
| JP | 2004-223507 | 8/2004 |
| WO | WO03-005424 | 1/2003 |

* cited by examiner

*Primary Examiner*—William P Fletcher, III
(74) *Attorney, Agent, or Firm*—Harness, Dickey & Pierce, P.L.C.

(57) ABSTRACT

A pattern forming method for forming a functional film with a prescribed pattern on a substrate using a droplet discharge method, the pattern forming method includes: a sub region configuration process for: configuring, in a design pattern of the functional films a plurality of sub regions which divide the designing pattern; and categorizing the plurality of sub regions into a plurality of non-adjacent groups; a first drawing process for arranging the liquid substance so as to draw a sub region that belongs to a first group categorized in the sub region configuration process; and a second drawing process for arranging the liquid substance so as to draw a sub region that belongs to a second group categorized in the sub region configuration process; wherein a solidification process for solidifying the liquid substance arranged in the first drawing process is provided between the first drawing process and the second drawing process.

5 Claims, 10 Drawing Sheets

METHOD OF FORMING GATE WIRING PATTERN BY DROPLET DISCHARGE

RELATED APPLICATIONS

This application is a divisional of U.S. patent application Ser. No. 11/235,708 filed on Sep. 26, 2005. This application claims the benefit of Japanese Patent Application No. 2004-306602 filed Oct. 21, 2004. The disclosures of the above applications are incorporated herein by reference.

BACKGROUND

1. Technical Field

The present invention relates to a functional film formed using a droplet discharge method, and the method for forming a pattern of the functional film using the droplet discharge method.

2. Related Art

In recent years, a technique, using the droplet discharge method as a method for formation of fine wiring patterns, such as those used in semiconductor integrated circuits, has been disclosed. Japanese Unexamined Patent Publication No. 2003-317945 is an example of the related art. In the technology disclosed in this literature, a liquid substance, which includes a functional material (a conductive material for instance), is discharged from a droplet discharge head to a substrate, and arranges the material on the substrate, thereby forming a wiring pattern, and is considered to be very effective in handling small-batch multi-product manufacturing.

Since the wiring (functional film) pattern formed with the above method is of an extremely fine structure, the liquid substance arranged on the substrate endows with a great kinetic effect of the surface/interface (for example, surface tension or wetness) Setting aside the case where the liquid substance is arranged on the substrate in an independent droplet, in the case where a multiple droplets are overlapping on the substrate and the liquid substance is forming an aggregation of given patterns, the liquid substance pattern may be deformed or may be split by this kinetic effect. In other words, it may be difficult to form the liquid substance pattern according to the design pattern of the substrate.

SUMMARY

The advantage of the invention is to provide a functional film and a method for forming a pattern that allows the formation of the functional film pattern with a high precision of line width and of shape, etc.

According to an aspect of the invention, a pattern forming method for forming a functional film with a prescribed pattern on a substrate using a droplet discharge method, the pattern forming method includes: a sub region configuration process for: configuring, in a design pattern of the functional film, a plurality of sub regions which divide the designing pattern; and categorizing the plurality of sub regions into a plurality of non-adjacent groups; a first drawing process for arranging the liquid substance so as to draw a sub region that belongs to a first group categorized in the sub region configuration process; and a second drawing process for arranging the liquid substance so as to draw a sub region that belongs to a second group categorized in the sub region configuration process; wherein a solidification process for solidifying the liquid substance arranged in the first drawing process is provided between the first drawing process and the second drawing process.

Here, the functional film indicates a membranous substance that exhibits a prescribed function, and includes a luminescence film, a coloring film, and a conductive film, etc. The main functions of these functional films are luminance, absorptivity, and conductivity. The functional material that has such main functions may include, for instance, an organic electro luminescence (EL) material as a luminescence material, pigments as an absorptive material, and a metal as a conductive material.

The design pattern indicates a motif pattern of the functional film to be formed, and is represented this way in order to distinguish itself from the actual pattern formed with the liquid substance or film material.

As mentioned above, in the case where the liquid substance is forming an aggregation of given patterns, the liquid substance pattern may be deformed or split as a result of wetting or surface tension. The behavior of such liquid substance largely depends on the sizes and shapes of the liquid substance pattern that is arranged on the substrate.

With the method for forming a pattern according to the above aspect of the invention, a pattern of functional film is formed per group of non-adjacent sub regions, thereby allowing the behavior control of the liquid substance arranged on the substrate, by the shapes and sizes of the configured sub regions. Hence, the pattern can be formed in a high precision of line width and of shape, etc.

In this case, in the pattern forming method, the solidification process may dry the liquid substance arranged in the first drawing process.

In a drawing process that performs drying, the functional film is obtained by fixing a solid content contained in the liquid substance, performed by drying it. Here, a highly larger quantity, in comparison to the volume of the obtained functional film, of the liquid substance is required when drawing in accordance with the design pattern, the size of which significantly effects the behavior of the liquid substance and the shapes of the patterns. In the above aspect of the invention, since the liquid substance pattern is solidified per sub regional group, it is possible to obtain the functional film in a high precision with the pattern forming method using the drying process.

The solidification process can be conducted, for instance, by radiating ultraviolet rays on the liquid substance that includes a light coagulated resin as the liquid substance. However, in that case, the possible composition of the liquid substance is limited. In this method for forming the pattern, the liquid substance pattern, formed in the first drawing process, is solidified by drying it, thereby broadening the choice for liquid substances.

In this case, in the pattern forming method, the sub region configuration process may configure the sub region to have a shape which is possible to regulate so that it has an approximate constant width.

Here, the constant, possible-to-regulate shape indicates a shape that can be objectively regulated to have a constant width, such as a rectangular shape, or a shape such as a quadrate, in which the width and the length cannot be distinguished. Moreover, circular or elliptical shapes also fall under that category, considering their diameter or the length of their minor axis as a width. Further, among trapezoids, where the width may change, particularly those having a small amount of change in their width, may also fall under that category.

In the case where the liquid substance is arranged on the substrate in a specific design pattern, the behavior of the liquid substance is strongly influenced by the width of the design pattern. For example, if the liquid substance is arranged in the design pattern where a wide region and a narrow region are merged, the liquid substance flows from the narrow region to the wide region, because of the difference of the curvature (which depends on the width) at the liquid substance surface, resulting in a thickness difference between the two regions. Consequently, if the liquid substance pattern is formed while containing the regions in which the widths significantly differ, the behavior of the liquid substance cannot be controlled well.

With the pattern forming process according to the above aspect of the invention, the above problem can be avoided by making the sub regions have shapes with constant widths.

In this case, in the pattern forming method, the sub region configuration process may conduct a division of the sub region or a categorization of a group, so that the sub regions, which are regulated to have comparable widths, belong to the same group.

The widths of the sub regions have a great effect on the behavior of the liquid substance, in case the liquid substance pattern that corresponds to the sub regions is formed. Hence, the liquid substance can be appropriately controlled, by making the sub regions having similar widths belong to the same group.

In this case, in the pattern forming method, the design pattern of the functional film may include a long, thin, extended region; the sub region may be configured, along the direction in which the extended region extends, so as to segment the extended region at a certain prescribed length or less; and the prescribed length may be equal to one interval between protruding portions which emerge in approximately even intervals in a liquid substance pattern, formed if the second liquid substance is arranged at once so as to draw a strap-like pattern with the same width as the extended region.

Here, the extended long and thin regions do not necessarily indicate only a rectilinear shape, and may also indicate a bended belt-shape.

In the case of arranging the liquid substance in the design pattern that is extended long and thin, protruding portions (bulges) of liquid huddling may be formed in the liquid substance pattern, as a result of the behavior of the liquid substance after its discharge. According to the knowledge of the inventor, the protruding portions are thought to emerge as a result of the liquid substance arranged in a region with a narrow width, which causes the liquid substance to reduce the increased internal pressure.

According to this pattern formation method, in the case where the design pattern of the functional film includes a region extended long and thin, it is possible to form the liquid substance pattern in a high precision without the emerging of the aforementioned protruding portions, by configuring the sub regions while segmenting the pattern to regions smaller than the occurrence interval of the protruding portions.

In this case, in the pattern forming method, the design pattern of the functional film may include a long, thin, extended region; and the sub region may be configured, along the direction in which the extended region extends, so as to segment the extended region at a certain prescribed length or less; the pattern forming method may further include: a dummy pattern forming process which is performed prior to the sub region configuration process, and in which the second liquid substance is arranged on a dummy substrate so as to draw the strap-like pattern with the same width as the extended region, thereby forming a dummy pattern; wherein the prescribed length may be regulated by the intervals between the protruding portions which emerge in approximately even intervals in the dummy pattern.

The intervals of the aforementioned protruding portions depend on the wetness between the liquid substance and the substrate surface, the surface tension of the liquid substance, the width of the design pattern, and the quantity of the arranged liquid substance; they change according to the kind of the functional film to be formed. According to this pattern forming method, it is possible to know the occurrence interval of the protruding portions, by forming, in advance, the dummy pattern on the dummy substrate, on which the processing is performed with the same conditions (the quality of material, the method of surface processing, the composition of the liquid substance, or the like) as that of the functional films to be formed.

In this case, in the pattern forming method, a liquid-repellent processing or a bank formation may be performed on a surface, on which the pattern of the substrate is formed, in a manner that surrounds a region corresponding to the design pattern of the functional film.

In this pattern forming method, it is possible to securely keep the liquid substance that is arranged on the substrate within the sub regions, using the liquid-repellent processing and the bank formation.

According to another aspect of the invention, a functional film formed in a prescribed pattern is formed so that it is divided into a plurality of sub regions.

The functional film, according to the above aspect of the invention, is formed by a sub region unit, excelling in the precision of film thickness and the shape of the pattern.

In this case, in the functional film, the sub region may be a region with a shape which is possible to regulate so that it has an approximately constant width.

The sub regions of the functional film are configured to a shape that can be regulated so that it has an approximately constant width, excelling in the precision of film thickness and the shape of the pattern.

BRIEF DESCRIPTION OF THE DRAWINGS

The invention will be described with reference to the accompanying illustrations, wherein like numbers refer to like elements, and wherein.

DESCRIPTION OF EXEMPLARY EMBODIMENTS

The desirable embodiments of the present invention will now be described in detail using the attached illustrations.

The embodiments described hereafter are the specific examples desirable to the invention, in which various technical limitations appropriate to those examples are appended. However, the scope of the present invention shall not be limited to those configurations, unless there is a specific statement to limit the invention in the descriptions hereafter. The size ratio of the patterns shown in the figures referred in the descriptions hereafter does not necessarily match the real size ratio.

(Structure of Droplet Discharge Device)

Figure 1:
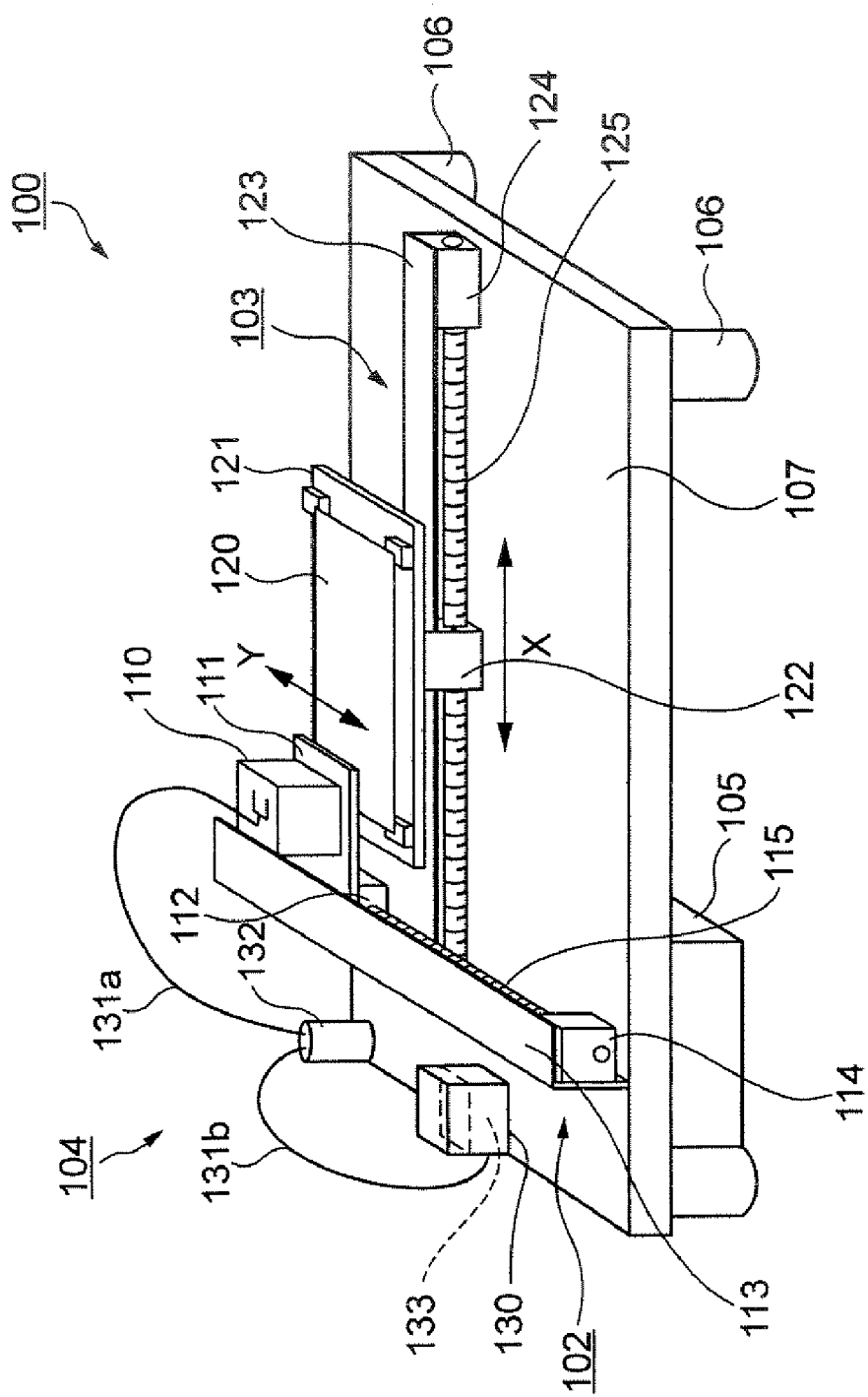
FIG. 1 is an oblique illustration showing a schematic structure of a droplet discharge device in the embodiment.

First, a structure of a droplet discharge device used for drawing patterns is described with reference to FIG. 1. FIG. 1 is an oblique illustration showing a schematic structure of the droplet discharge device in the embodiment.

A droplet discharge device 100, as shown in FIG. 1, includes: a head mechanism 102, which has a head unit 110 that discharges droplets; a substrate mechanism 103 which is formed on a substrate 120, which is a droplet discharge target of droplets discharged from the head unit 110; a liquid substance supply unit 104 that supplies a liquid substance 133 to the head unit 110; and a control unit 105 that controls the supply unit and each of the mechanisms as a whole.

The head unit 110 has a plurality of nozzles, and can discharge droplets from each nozzle toward the substrate 120. The discharge of the droplets can be controlled per nozzle by the control unit 105. Most flat plate-like materials, such as a glass substrate, a metal substrate, a synthetic resin substrate or the like, can be utilized as the substrate 120.

The droplet discharge device 100 is provided with a plurality of supporting legs 106 placed on the floor, and a surface plate 107 placed on them. On the upside of the surface plate 107, the substrate mechanism 103 is arranged in the lengthwise direction (direction of X-axis) of the surface plate 107, and above the substrate mechanism 103, the head mechanism 102, supported at its ends by two pillars that are fixed on the surface plate 107, is arranged in the direction that crosses the substrate mechanism 103 at a right angle (direction of Y-axis). Moreover, on one of the edge of the surface plate 107, the liquid substance supply unit 104, which is connected from the head unit 110 of the head mechanism 102, supplies the liquid substance 133. Further, the control unit 105 is placed, under the surface plate 107.

The head mechanism 102 is provided with: the head unit 110 that discharges the liquid substance 133; a carriage 111 that mounts the head unit 110; a Y-axis guide 113 that guides the carriage 111 to move in the direction of Yaxis; a Y-axis drilling screw thread 115 arranged along the Y-axis guide 113; a Y-axis motor 114 that rotates the Y-axis drilling screw thread 115 forward and backward; and a carriage screw-in portion 112, in which an internal thread portion that moves the carriage 111 while screwing in with the Y-axis drilling screw thread 115, is formed, the carriage screw-in portion 112 being located under the carriage 111.

The moving mechanism of the substrate mechanism 103 is arranged in the similar structure as that of the head mechanism 102, in the direction of X-axis, and includes: a placement table 121 that holds the substrate 120; an X-axis guide 123 that guides the placement table 121 to move; an X-axis drilling screw thread 125 arranged along the X-axis guide 123; an X-axis motor 124 that turns the X-axis drilling screw thread 125 forward and backward; and a placement table screw-in portion 122, located under the placement table 121, and moves the placement table 121 while screwing in with the X-axis drilling screw thread 125.

In the head mechanism 102 and in the substrate mechanism 103, a location-detecting unit (not shown), which detects the location of the head unit 110 and the placement table 121 after their movement, is provided respectively. There is a mechanism, which adjusts the direction of rotation, the direction thereof being the Z-axis that is orthogonal to the X-axis and the Y-axis, is embedded into the carriage 111 and the placement table 121, and allows the adjustment of rotation direction of the head unit 110 and of the placement table 121.

With such structure, the head unit 110 and the substrate 120 can reciprocate freely relatively to the Y-axis and the X-axis. The description of the head unit 110 is as follows. The Y-axis drilling screw thread 115 rotates forward and backward by bi-directional rotation of the Y-axis motor 114. The carriage 111, which is unified with the carriage screw-in portion 112, moves to a given location, as the carriage screw-in portion 112, which is screwed together to the Y-axis drilling screw thread 115, moves along the Y-axis guide 113. In other words, the drive of the Y-axis motor 114 allows a free movement of the head unit 110 mounted on the carriage 111, in the direction of Y-axis. Similarly, the substrate 120 placed on the placement table 121 moves freely in the direction of X-axis.

As described, with the drive control of the X-axis motor 124 and the Y-axis motor 114, a relative move of the head unit 110 to the substrate 120 is enabled, so that the droplets can be discharged to a given location on the substrate 120. Moreover, synchronization of the location control and the discharge control of the head unit 110 allows a drawing of a given pattern on the substrate 120.

The liquid substance supply unit 104, which is located at one end of the surface plate 107, supplying the liquid substance 133 to the head unit 110 includes: a tube 131a that forms a channel that connects to the head unit 110; a pump 132 that sends in the liquid to the tube 131a; a tube 131b (channel) that supplies the liquid substance 133 to the pump 132; and a tank 130, connected to the tube 131b and stores the liquid substance 133.

(About Forming Gate Wiring)

Hereafter, the pattern formation of the functional film is described using a gate wiring for Thin Film Transistor (TFT) as an example. Note that this gate wiring in the explanation below is merely an example of the functional films, and the functional film, to which the present invention applies, varies widely. The variation includes: an wide variety of variations of patterns of conductive film (wiring) in an electronic device; a luminescence cell film of an organic electro luminescence (EL) display panel; and a color filter film of a liquid crystal display panel, etc.

(Structure of Gate Wiring)

Figure 2:
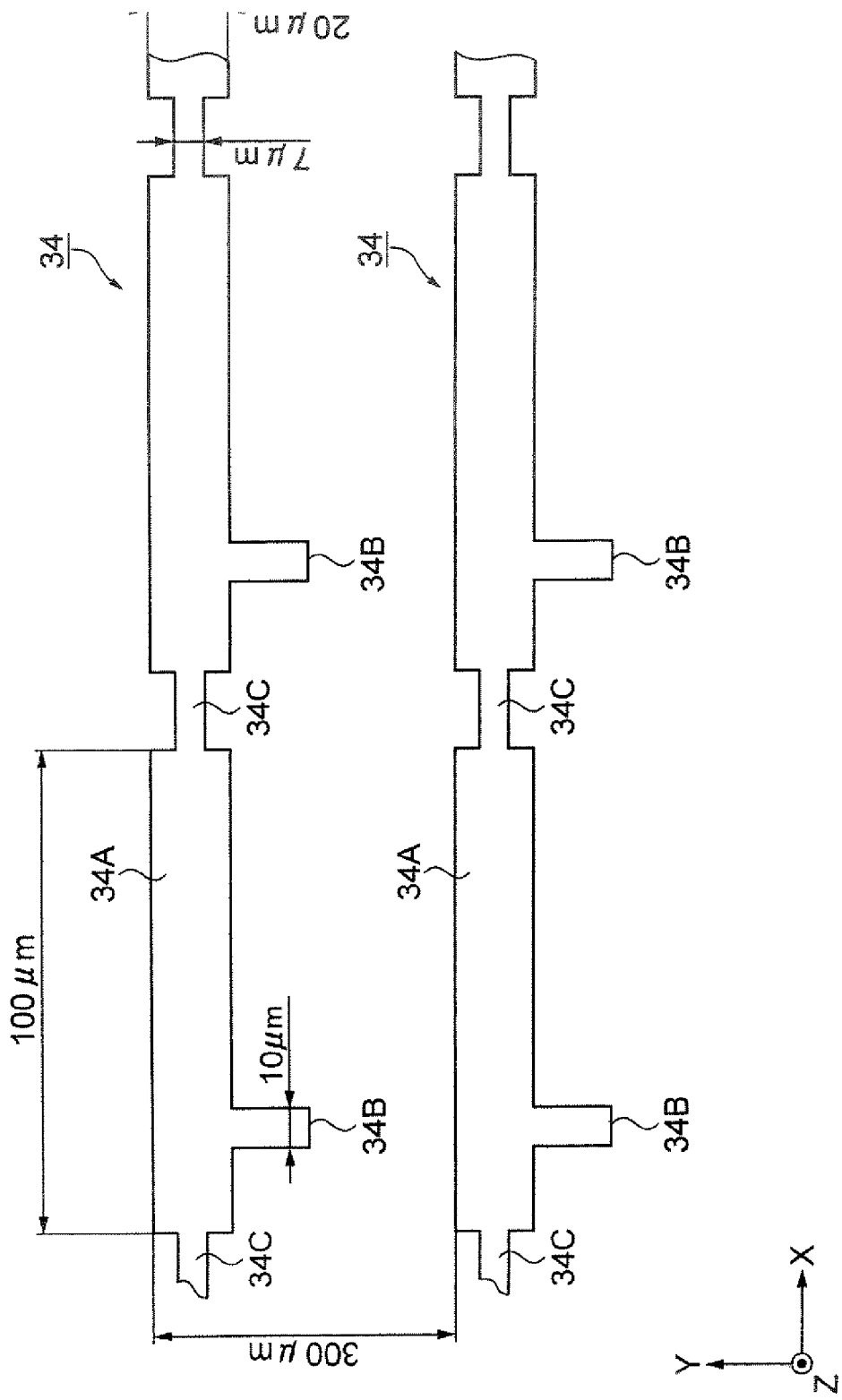
FIG. 2 is a top view illustration, showing an example of gate wirings for Thin Film Transistors (TFTs)

FIG. 2 is a top view illustration, showing an example of gate wirings for TFTs.

In FIG. 2, a gate wiring 34 corresponds to the functional film according to the embodiment of the invention. Each of the plurality of gate wirings 34 formed in strip has a wide portion 34A, a gate electrode portion 34B and a narrow portion 34C. Here, in FIG. 2, ratio of lengths and widths of the wide portion 34A, the gate electrode 34B, and the narrow portion 34C does not necessarily match the actual ones.

The wide portion 34A is a main part that extends itself in the direction of X-axis in the gate wiring 34. Moreover, the width of the wide portion 34A, in other words, the length of the side that is orthogonal to the lengthwise direction of the wide portion 34A, is longer than the widths of the gate electrode portion 34B and the narrow portion 34C. More specifically, the width of the wide portion 34A is approximately 20 μm.

The gate electrode portion 34B sticks out from the wide portion 34A in the direction of Y axis, and constitutes a gate electrode of a TFT element. The width of the gate electrode portion 34B is approximately 10 μm, which is shorter than the width of the wide portion of 34A.

The width of the narrow portion 34C is narrower than the wide portion 34A in the gate wiring 34. This portion is at a location, where a source wiring and a drain wiring (neither of them shown), formed by a device manufacturing process (described later), cross. Hence, in order to reduce the electro capacitance generated by the overlap of wirings, the width of the narrow portion 34C is formed narrow. More specifically, the width of the narrow portion 34C is approximately 7 μm.

(Schematic Structure of Liquid Substance)

The liquid substance for forming the gate wiring 34 may include a substance in which conductive microparticles, which serves as a functional material, are dispersed in disperse medium. Variations of conductive microparticles dispersed in the liquid substance may include: metallic microparticles containing any one of gold, silver, copper, palladium, or nickel; conductive polymer or superconducting microparticle, etc.

These conductive microparticles can have organic matter or the like, coated on their surfaces, in order to improve the dispesibility. Examples for the coating material for coating the surfaces of the microparticles could be citric acid, etc.

The particle size of the conductive microparticle is preferably between 5 nm and 0.1 μm inclusive. This is because, if the size is larger than 0.1 μm, nozzle clogging of the head of the droplet discharge device (described later) tends to occur, and the discharge with droplet discharge method becomes troublesome. Further, if the size is smaller than 5 nm, a volume ratio of the coating material to the conductive microparticle increases, and the proportion of the organic matter obtained in the film becomes excessive.

The room temperature vapor pressure of the disperse medium of the liquid that contains the conductive microparticles is preferably between 0.001 mmHg and 200 mmHg inclusive (approximately equal to or larger than 0.133 Pa and 26600 Pa or less). This is because if the vapor pressure is higher than 200 mmHg, the disperse medium rapidly evaporates after the discharge, and the formation of favorable film becomes difficult.

The vapor pressure of the disperse medium is preferably between 0.001 mmHg and 50 mmHg inclusive (approximately equal to or larger than 0.133 Pa and 6650 Pa or less). This is because if the vapor pressure is higher than 50 mmHg, nozzle blockage caused by the desiccation tends to occur, when discharging droplets with the droplet discharge method, and the safe discharge becomes difficult.

On the other hand, if the vapor pressure of the disperse medium in the room temperature is lower than 0.001 mmHg, the desiccation slows down and the disperse medium tends to stay in the film; hence it becomes harder to obtain a high quality conductive film after a thermal and/or photo processing (post processing).

Which disperse medium to be used is not specifically limited as long as the conductive microparticles can be dispersed and does not cause aggregation. More specifically, the material may include: water; alcohols such as methanol, ethanol, propanol, butanol, etc.; chemical compound of hydrocarbon halide system, such as n-heptane, n-octane, decane, toluene, xylene, cymene, durene, indene, dipentene, tetrahydronaphthalene, decahydronaphthalene, cyclohexylbenzene, etc.; chemical compound of ether system, such as ethylene glycol dimethyl ether, ethylene glycol diethyl ether, ethylene glycol ethyl methyl ether, diethylene glycol dimethyl ether, diethylene glycol diethyl ether, diethylene glycol methyl ethyl ether, 1,2-dimethoxyethane, bis(2-methoxyethyl) ether, p-dioxane, etc.; and polar compound such as propylene carbonate, γ-butyrolactone, N-methyl-2-pyrrolidone, dimethylformamide, dimethyl sulfoxide, cyclohexanone, etc. Among the above, water, alcohols, chemical compound of hydrocarbon halide system, chemical compound of ether system are preferable in terms of easiness in applying to the droplet discharge method, among which water and the chemical compound of hydrocarbon halide are more suitable. These disperse mediums can be used by itself or as a mixed composite of 2 or more variations.

Dispersoid density of the conductive microparticles should preferably be between 1 to 80 weight fraction inclusive, and can be adjusted corresponding to the film thickness of the desired conductive film. More than 80 weight fraction tends to cause aggregation, and it becomes more difficult to obtain an even film.

Surface tension of the liquid substance should preferably be in the range of 0.02 N/m and 0.07 N/m inclusive. When discharging the liquid substance with the droplet discharge method, if the surface tension is less than 0.2 N/m, the wetting of an ink composition against a surface of the nozzle increases; hence a flight course bending tends to occur. If the surface tension exceeds 0.07 N/m, then the meniscus formation at the tip end part of the nozzle does not stabilize; causing the control of the discharge quantity and the discharge timing to be difficult.

In order to adjust the surface tension, a small amount of surface tension adjustment material can be added into disperse liquid, as long as it does not unreasonably decline a contact angle with a substrate S. The material may be of fluorine, silicon, non-ion systems. The surface tension adjustment material of non-ion system betters the wetting of the liquid against the substrate, improves the leveling of the film, and contributes to prevent the occurrence of asperity or orange peel surface of the film. The disperse liquid may contain organic chemical compound such as alcohol, ether, ester, ketone or the like, if necessary.

Moreover, binder resin can be added into the liquid substance in order to improve a fixative when it is formed into a film. Copolymer of acrylates or styrene, for instance, may be used for the binder resin. Considering the fixative of the formed film, the larger the quantity of the binder resin the better. However, considering the conductivity, which is the main function of the conductive film, it is desirable that the quantity of the binder resin is small.

It is desirable that the viscosity of the disperse liquid is between 1 mPa·s and 50 mPa·s inclusive. When discharging liquid with the droplet discharge method, if the viscosity is smaller than 1 mPa·s, then the peripheral of the nozzle tends to be contaminated by the spill out of the ink; and if the viscosity is larger than 50 mPa·s, then the clogging frequency of the nozzle hole increases, toughening the smooth droplet discharge.

(Overall Explanation of Gate Wiring Formation Process)

Figure 3:
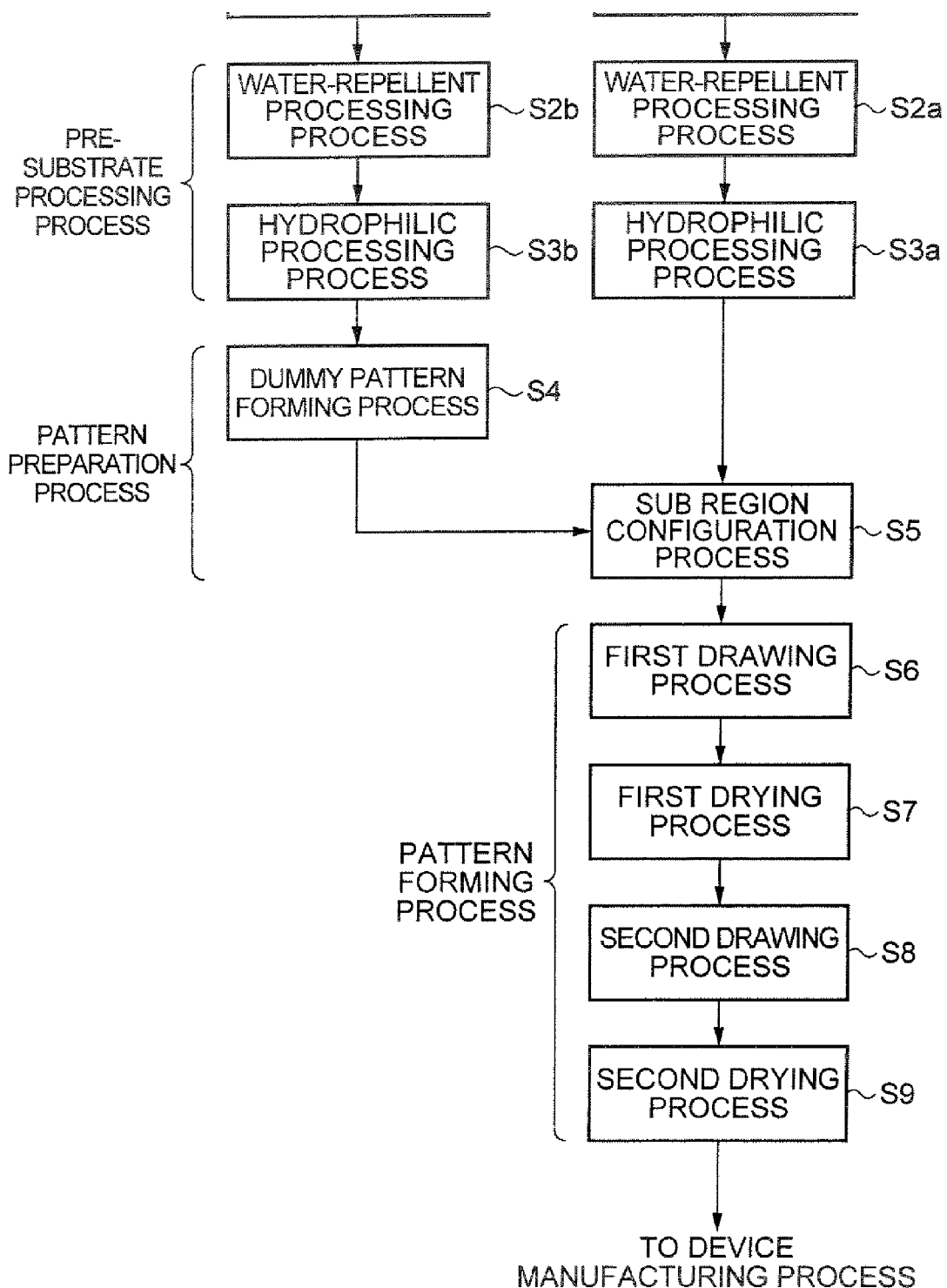
FIG. 3 is a flow chart describing pattern-forming processes of the gate wirings.
Figure 4A:
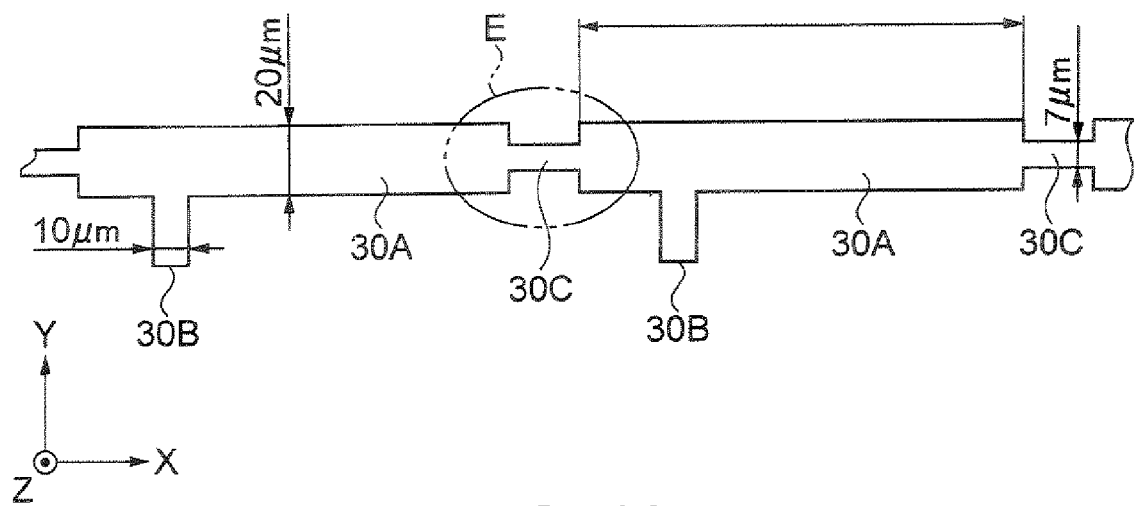
FIG. 4A is an illustration showing a design pattern of the gate wiring for the Thin Film Transistor (TFT)
Figure 4B:
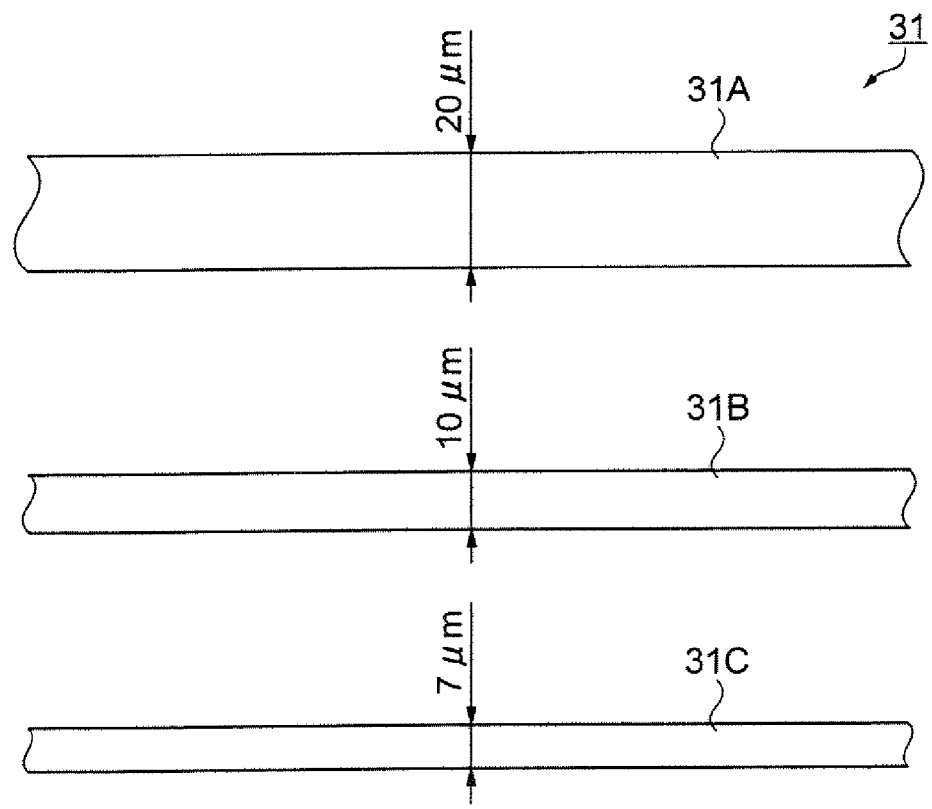
FIG. 4B is an illustration showing a design pattern of dummy patterns.

Hereafter, the overall process of the gate wiring formation will be described using the flow chart in FIG. 3, and with reference to FIGS. 4A, 4B and FIGS. 5 through 7. FIG. 3 is the flow chart describing pattern-forming processes of the gate wirings. FIG. 4A is an illustration showing a design pattern of the gate wiring. FIG. 4B is an illustration showing the design patterns of dummy patterns. Here, the design pattern means a motif pattern of the functional film to be formed, and is represented this way in order to distinguish itself from the actual pattern formed with the liquid substance or film material.

Prior to the pattern formation of the aforementioned gate wiring 34 (refer to FIG. 2), a substrate is prepared (S1a of FIG. 3). Materials for the substrate is appropriately selected from glass, silicon, resin, or the like, and applied according to the kind of device to manufacture, and which part of the device it is for. In the embodiments, the glass substrate is used. Here, another substrate with the same condition as that of the one used for a product (in terms of quality of material, smoothness of surface, etc.), is also prepared as a dummy substrate (S1b of FIG. 3).

Thereafter, a liquid-repellent processing is performed on the substrate surface (plane on which the wiring pattern will be formed) (S2a of FIG. 3). The liquid-repellent processing may include, for instance, a method of forming a self assembled monolayer on the substrate surface. "SAM: Self-Assembled-Monolayerse" is a fine single layer of molecules, in which a chemical compound coexists with a frame plane in either fluid or gas form, the chemical compound, in which a functional group that can be bonded with constituent atoms of the formation surface of the film is bonded in a linear chain molecule. Therefore the functional group is adsorptive to film forming surfaces, and is bonded with the constituent atoms on them. Thereby, the SAM is formed on the film-forming surface in the linear chain molecule. In the embodiments, the SAM is formed by leaving the substrate and heptadecafluoro-tetrahydro-desyl-triethoxysilane, in a same airtight container in the room temperature for 96 hours. Here, the liquid-repellent processing with the same condition is performed on the dummy substrate prepared previously (S2b in FIG. 3).

After the liquid-repellent processing (S2a of FIG. 3), a hydrophilic processing is performed on a region for forming the gate wiring, on the substrate surface (S3a of FIG. 3). More specifically, the hydrophilic processing is conducted with: plasma oxygen being radiated via a mask (plasma processing method), which is die-cut with the design pattern of the gate wiring (refer to FIG. 4A); and a removal of self-assembled molecules and other adhered impurities in the irradiated region.

With this process, the hydrophilic region in the design pattern of the gate wiring is formed on the substrate surface. Since the outside of this hydrophilic region is liquid-repellent region, it is possible, in the pattern forming process described later, to form the liquid substance pattern in accordance with the design pattern, in a high precision.

Here, the similar hydrophilic processing is performed on the dummy substrate prepared in advance (S3b of FIG. 3). However, unlike the case of the proper substrate, the hydrophilic region formed has a long and thin strap-like shape as shown in FIG. 4B.

The aforementioned liquid-repellent processing process and the hydrophilic processing process are together called a pre-substrate processing process. This pre-substrate processing process is conducted in order to form a liquid substance pattern in a high precision, in accordance with a design pattern 30. Note that the pre-substrate processing process is not a mandatory process for conducting the pattern forming process that will be described later, and is not mandatory in order to obtain the effect of the invention.

In addition to the aforementioned method, the pre-processing process of the substrate may include a method so called a bank formation, which will now be described.

In the bank formation, a bank-shaped resin structure (a bank) is formed on the substrate along the outline of the design pattern by using a resist technique. An arylic resin used here may include a polyimide resin, or the like.

The hydrophilic process may be performed on the substrate surface prior to the bank formation, and the liquid-repellent processing may be conducted to the bank portion after the bank formation. The plasma processing method (CF4 plasma processing method), with the use of tetrafluoromethane as a processing gas in atmospheric air, may, for example, be used as the liquid-repellent processing method. The liquid-repellent processing may be omitted by using, as the bank resin, the material with water-repellency (a resin material with fluorine group, for instance).

After the hydrophilic processing processes (S3a, S3b), the liquid substance discharge is conducted on the dummy substrate, so as to draw a design pattern 31 shown in FIG. 4B; thereby the dummy pattern is formed (S4 in FIG. 3). Here, the quantity of the liquid substance arranged on the dummy substrate is equal to the amount necessary in order to obtain a film thickness of a production-ready gate wiring 34 (refer to FIG. 2).

In FIG. 4B, the design pattern 31 of the dummy pattern consists of strap-like portions 31A, 31B, and 31C with long and thin strap-like shapes, and the width of the strap-like portion 31A is equal to that of a wide portion 30A, which corresponds to the wide portion 34A in FIG. 2, in the design pattern 30 of the gate wiring. Moreover, the width of the strap-like portion 31B and the width of the strap-like portion 31C are respectively equal to those of the a gate electrode portion 30B (corresponding to the gate electrode portion 34B in FIG. 2), and a narrow portion 30C (corresponding to the narrow portion 34C in FIG. 2), both of which are in the design pattern 30 of the gate wiring.

The dummy pattern forming process deeply relates to a subsequent sub region configuration process (S5 in FIG. 3), which will be described in detail later.

After the dummy pattern forming process, the design pattern 30 of the gate wiring (shown in FIG. 4A) is divided into sub regions, each of which is categorized into groups (sub region configuration process S5 in FIG. 3). This sub region configuration process does not include any processing to the substrate, and rather it is a kind of an information processing.

Figure 5:
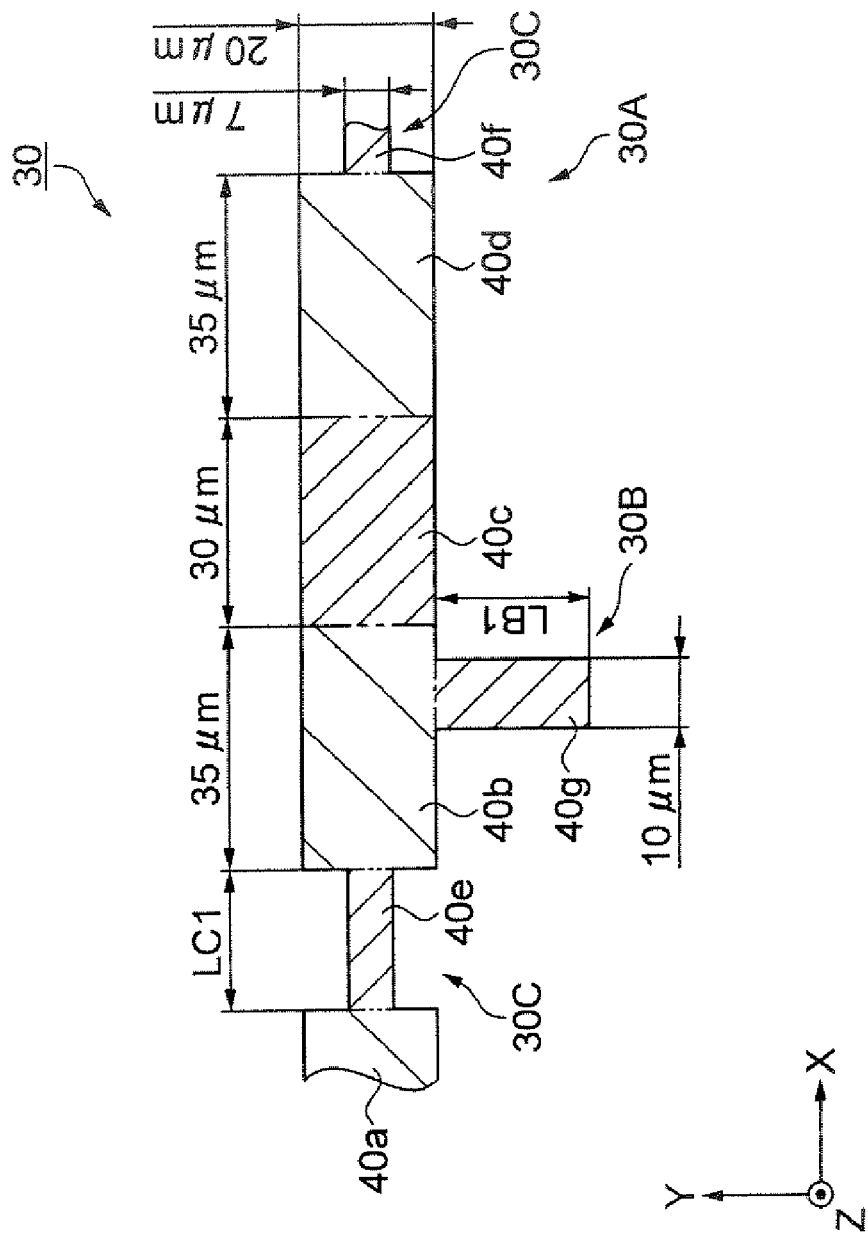
FIG. 5 is an illustration showing an example of sub-regional division of the design pattern of the gate wiring.

FIG. 5 is an illustration showing an example of sub-regional division of the design pattern of the gate wiring. In this figure, borders between the adjacent sub regions are shown in imaginary lines. Further, out of convenience, sub regions that belong to the same group are shown in the same hatching.

As shown in FIG. 5, the design pattern 30 is divided into rectangular shaped sub regions 40a through 40g. The wide portion 30A consists of the sub regions 40b and 40d (40a) with 20 μm in width and 35 μm in length, and the sub region 40c with 20 μm in width and 30 μm in length. The region in the gate electrode portion 30B is the sub region 40g with 10 μm in width and LB1 in length. The region in the narrow portion 30C is the sub region 40e (40f) with 7 μm in width and LC1 in length.

The grouping of the sub regions are performed in a way that any adjacent sub regions do not belong to the same group. In the embodiments, as shown in FIG. 5, the sub regions 40a, 40b, and 40d are categorized in A group, and the sub regions 40c, 40e, 40f and 40g are categorized in B group. Particularly, in the embodiment, the sub region 40g, regulated to have the width of the gate electrode portion 3OB (10 μm), and the sub regions 40e and 40f, regulated to have the width of the narrow portion 30C (7 μm), all belongs to the same B group. Therefore, in the case of configuring sub regions so that sub regions that are regulated to have comparable widths belong to the same group, more pertinent control can be expected (described in detail later). The grouping does not necessarily result in 2 groups. As long as it satisfies the condition of "adjacent sub regions not belonging to the same group", it can result in 3 or 4 groups.

As described, the design pattern 30 consisting of complex shapes, is divided into the rectangular sub regions 40a through 40g regulated so that they have a given width and length, and those sub regions are sorted into groups. There are several points of concern for sub-regional division, which deeply relates to the aforementioned dummy pattern forming process (S4 of FIG. 3), and which will be described in detail later.

When the sub-regional division and the grouping is performed, the liquid substance discharge is conducted based on the design pattern 30 after the sub region configuration (refer to FIG. 5) (A first drawing process S6 in FIG. 3), More specifically, the design pattern 30 shown in FIG. 5 is stored in the droplet discharge device 100, then the substrate, on which the pre-substrate processing (S2a and S3a in FIG. 3) is performed, is placed on the placement table 121 (refer to FIG. 1), and the drawing with the droplet discharge method is conducted.

Figure 6:
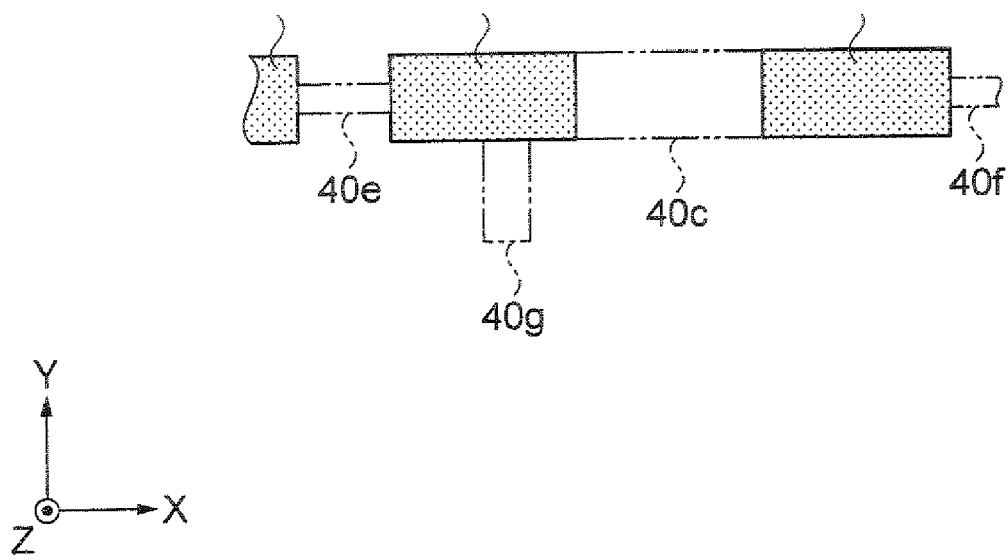
FIG. 6 is a top view illustration showing a liquid substance pattern formed in a first drawing process.

FIG. 6 is a top view illustration showing a liquid substance pattern formed in a first drawing process. In the figure, regions shown in virtual lines indicate the design pattern (sub regions) shown in FIG. 5.

As shown in FIG. 6, in the first drawing process, the liquid substance discharge is conducted so as to draw the sub regions 40a, 40b and 40d (refer to FIG. 5) that belongs to the A group in the design pattern 30, and patterns of liquid substance 33a, 33b and 33d (shown in hatching) are formed. On the substrate surface, the hydrophilic/liquid-repellent processing has already been performed in accordance with the design pattern 30 of the gate wiring shown in FIG. 4A, allowing the formation of patterns with sharp outlines.

Since the sub regions 40a, 40b and 40d that belong to the A group are selected so as not be adjacent to each other, the patterns of liquid substance 33a, 33b, and 33d each take an individual pattern. In other words, these patterns are governed by individual kinetic systems, which also means that the pattern control is conducted by the unit of sub regions 40a, 40b, and 40d.

Thereafter, the patterns of liquid substance 33a, 33b, and 33d are dried, and the functional material etc., contained in the liquid substance, is fixed on the substrate (a first drying process S7 in FIG. 3) The drying process as a solidification process may be conduced with the substrate transferred to a drying device, or it may also be conducted with the substrate placed on the placement table 121 (refer to FIG. 1) by a manufacturing device that combines the droplet discharge device 100 (refer to FIG. 1) and the drying device. In this drying process, the disperse medium and other kinds of solvents evaporate, and wiring films 38a, 38b, and 38d are formed as the conductive films containing conductive material.

Thereafter the liquid substance discharge is conducted again (a second drawing process S8 in FIG. 3) to the substrate, on which the first drying process forms the wiring films 38a, 38b, and 38d. More specifically, the liquid substance is discharged so as to draw the sub regions 40a, 40b, and 40d that belong to the B group, and the patterns of liquid substance are formed.

Figure 7:
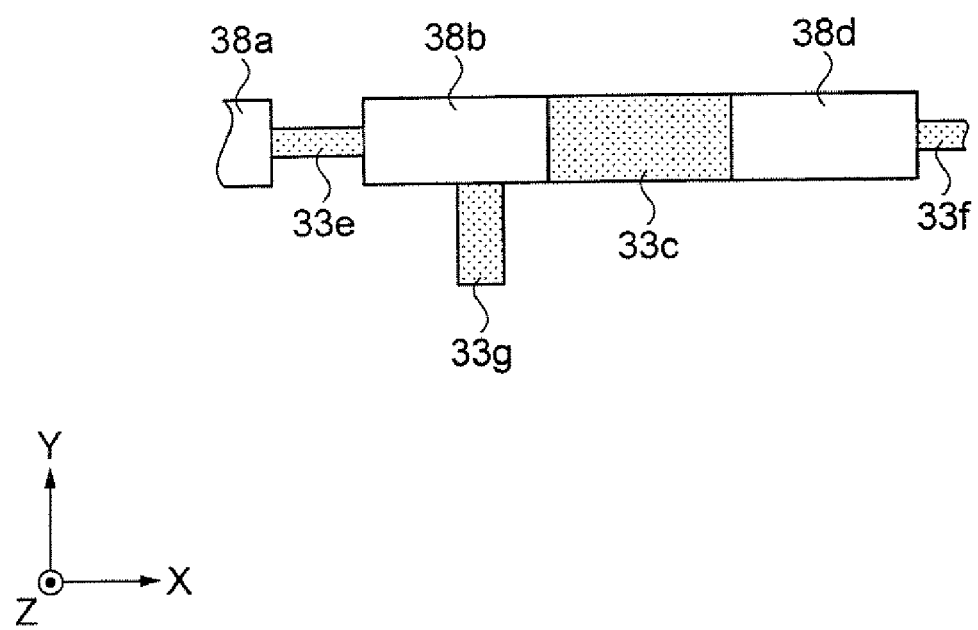
FIG. 7 is a top view illustration showing a liquid substance pattern formed in a second drawing process.

FIG. 7 is a top view illustration showing the liquid substance pattern formed in the second drawing process.

In FIG. 7, patterns of liquid substance 33c, 33e, 33f and 33g (shown in hatching) are formed as the patterns that correspond to the sub regions 40c, 40e, 40f, and 40g in FIG. 6. On the substrate surface, the hydrophilic/liquid-repellent processing has already been performed in accordance with the design pattern 30 of the gate wiring shown in FIG. 4A, allowing the formation of patterns with sharp outlines.

Since the sub regions 40c, 40e, 40f and 40g that belong to the B group are selected so as not be adjacent to each other, the patterns of liquid substance 33c, 33e, 33f, and 33g that correspond to this group region, each take an individual pattern. That is to say, these patterns are governed by individual kinetic systems. Moreover, in other words, it also means that the pattern control is conducted by the unit of sub regions 40c, 40e, 40f and 40g.

After forming the patterns of liquid substance 33c, 33e, 33f, and 33g, the whole substrate is dried by, for instance, transferring it to the drying device (a second drying process S9 in FIG. 3), and the functional material etch, contained in the liquid substance is fixed on the substrate. The patterns of liquid substance 33c, 33e, 33f, and 33g are united with the previously formed wiring films 38a, 38b, and 38d; thereby forming the gate wiring 34 (refer to FIG. 2).

The substrate, on which the gate wiring 34 (refer to FIG. 2) is formed, undergoes firing if required; thereafter it is transferred into the device manufacturing process; and then it is utilized as a wiring etc., of, for instance, the display device.

As described in the above explanation, the design pattern is divided into the plurality of sub regions; and drawing and drying of the patterns per non adjacent group of sub regions are conducted; thereby allowing the reliable control of the patterns of liquid substance in units of sub region.

(Details of Pattern Preparation Process)

In the above process, the dummy pattern forming process (S4 in FIG. 3) and the sub region configuration process (S5 in FIG. 3) are together called a pattern preparation process. Hereafter, the details of these processes will be described with reference to FIGS. 8 and 9.

Figure 8:
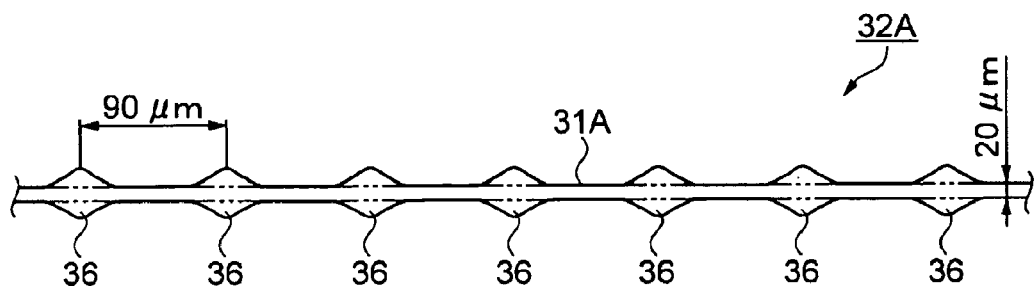
FIG. 8 is a top view illustration showing a part of the dummy pattern formed on a dummy substrate.

FIG. 8 is a top view illustration showing a part of the dummy pattern formed on the dummy substrate, of which pattern corresponds to the strap-like portion 31A in FIG. 4B.

In FIG. 8, the dummy pattern 32A made from the liquid substance does not match the strap-like portion 31A of the design pattern shown with the virtual lines, and have bulges 36 (protruding portions), which are liquid huddling that occur at even intervals. As described, even if the liquid substance (droplet) accurately landed on the substrate according to the design pattern (strap-like portion 31A), the liquid substance on the substrate behaves as governed by the kinetic effects such as wetting or surface tension, resulting in cases of its shape changing or splitting. One example of such cases is the occurrence of the bulges 36 that emerge when drawing, with the liquid substance, the design pattern that is extended long and thin. According to the knowledge of the inventor, the bulges 36 are thought to emerge as a result of the liquid substance arranged in a region with a narrow width, which causes the liquid substance to reduce the increased internal pressure.

Similar to the dummy pattern 32A in FIG. 8, the bulges 36 occur in approximately even intervals in the dummy patterns that correspond to the strap-like portion 31B and 31C shown in FIG. 4B, where the detailed explanation thereof is omitted. The occurrence interval of bulges tends to become shorter, as the width of the pattern narrows.

If bulges emerge when forming the liquid substance pattern as in the dummy pattern 32A in FIG. 8, the wiring film cannot be formed according to the design pattern. Therefore, it is important to know in advance the condition in which the bulges emerge. However, the condition of bulge immersion changes, depending on: the hydrophilicity of the hydrophilic region, the water-repellency of the liquid-repellent region; the surface tension of the liquid substance; the width of the strap-like portion; and the amount of arranged liquid substance. Hence, it is difficult to ascertain the condition applicable to various patterns by calculations.

This dummy pattern forming process is provided in consideration of the aforementioned circumstances. That is to say, by forming the dummy pattern with the regions, which are extended long and thin, and are included in the design pattern 30 of the gate wiring (refer to FIG. 4A); in other words, with the strap-like patterns provided with the same widths as that of the wide portion 30A, the gate electrode portion 30B, and the narrow portion 30C; it is possible to learn the relationships between the patterns and the widths.

For instance, in the example of the dummy pattern 32A shown in FIG. 8, the occurrence interval of the bulges 36 is approximately 90 μm. Due to the above, if the liquid substance pattern is formed at once according to the design pattern 30 in FIG. 4A, there is a high possibility that the bulge will emerge in the region equivalent to the wide portion 30A that extends in the length of 100 μm. In the embodiments, as shown in FIG. 5, the wide portion 30A is divided into the rectangular sub regions 40a, 40b and 40d, with 20 μm in width and 70 μm in length, as well as into the sub regions 40c, 40e, 40f and 40g, with 20 μm in width and 45 μm in length. As described, by dividing the wide portion 30A into the sub regions, of lengths equal to or smaller than the occurrence interval (approximately 90 μm) of the bulges 36 in the dummy pattern 32A, the immersion of the bulges can be preemptively prevented in the case of forming the liquid substance pattern.

The similar issue applies to regions equivalent to the gate electrode portion 30B or the narrow portion 30C. However, in the case of the embodiments, the lengths of the sub regions 40e and 40f are shorter than the occurrence intervals of the bulges that emerge in the dummy pattern corresponding to the strap-like portions 31B and 31C (refer to FIG. 4B); hence there is no need to divide the region.

Figure 9A:
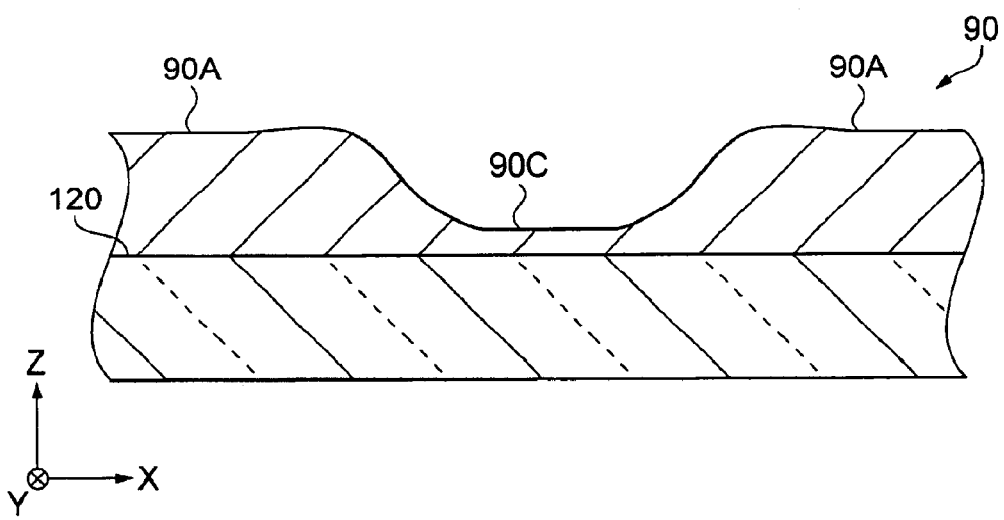
FIG. 9A and FIG. 9B are comparative examples to the embodiments, showing common examples of the liquid substance pattern.
Figure 9B:
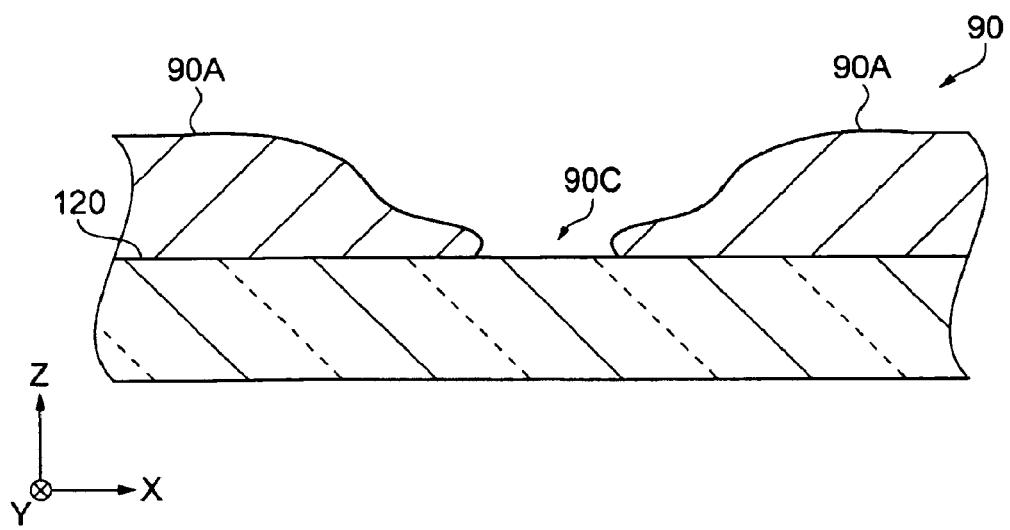

The occurrence of the aforementioned bulges is an example of the cases that the liquid substance pattern changes its shape due to the kinetic effects such as wetting or surface tension. Yet, moreover, there is another typical example other than such case, which will be described with reference to FIGS. 9A and 9B. FIG. 9A and FIG. 9B are comparative examples to the embodiments, sectional illustrations showing common examples of the liquid substance pattern.

A liquid substance pattern 90, shown in FIGS. 9A and 9B, is a schematic illustration equivalent to an imaginary line region E in FIG. 4A. In FIG. 9A, the thickness of a narrow portion 90C (corresponding to the narrow portion 30C in FIG. 4A) is thinner than that of a wide portion 90A (corresponding to the wide portion 30A in FIG. 4A). Moreover, in FIG. 9B, the liquid substance pattern is not formed at the narrow portion 90C, taking a shape that the pattern 90 is disrupted in the middle.

As described, in the location where the two regions with different widths come into conjunction, the transition of the liquid substance occurs between the two regions (in the example in FIGS. 9A and 9B, the wide portion 90A and the narrow portion 90C), which may result in defects or the immersion of inequality of film thicknesses. According to the knowledge of the inventor, it is considered that such migration phenomenon of the liquid substance is caused by the curvature difference of the surface of the liquid substance between the wide portion 90A and the narrow portion 90C. More specifically, if the pattern 90 is structured in an approximately even thickness, then the surface of the liquid substance of the narrow portion 90C has larger curvature than that of the wide portion 90A. The difference occurs not only in the curvature, but also in an internal pressure of the liquid substance, in order to balance its surface tension; therefore, the migration of the liquid substance occurs due to the internal pressure difference, resulting in the pattern shown in FIG. 9A or 9B in its normal status.

In the embodiments, as shown in FIG. 5, the design pattern 30 of the gate wiring is divided into the sub regions regulated to have a constant width, such as: the sub regions 40a through 40d regulated to have the width of the wide portion 30A (20 μm); the sub region 40g regulated to have the width of the gate electrode portion 30B (10 μm); and the sub regions 40e and 40f regulated to have the width of the narrow portion 30C (7 μm). Within the sub regions that can be regulated so that they have a constant width such as rectangular shape, the liquid substance does not emerge the aforementioned migration, and can maintain shape stability; thereby allowing the formation of an even film.

As described above, in the case of forming the liquid substance pattern, the shape and the size of its design pattern have a great effect on the behavior of the discharged liquid substance. With the pattern forming process according to the embodiments of the invention, the behavior of the liquid substance can be controlled by sub regional unit, regardless of the shape and size of the design pattern; thereby allowing the formation of patterns in a high precision of line width and of shape, etc.

In the embodiments, the drawing and drying of the A group is preceding that of the B group. Subsequently, the drawing and drying of the B group is conducted and the gate wiring is formed. However, these processes can be reversed. Here, it is desirable to select which preceding group of drawing and drying is to be conducted, by the degree of the wetting on the hydrophilic region of the liquid substance, where the hydrophilic processing is performed in accordance with the design pattern 30 (refer to FIG. 4A and FIG. 5).

In the case where the wetting is eminently large for instance, the liquid substance for the liquid substance patterns 33a and 33b spreads to the narrow sub regions 40e and 40g, if the drawing of the A group is conducted prior to the other; therefore resulting in a case where the precise liquid substance pattern formation is difficult in the first drawing process. In such case, it is desirable to first conduct the drawing and the drying of the B group that includes the narrow sub regions. If the sub region configuration is conducted so that the sub regions that are regulated to have similar widths belong to the same group, as in the embodiments, the control of regions by the order of group unit becomes possible.

FIRST MODIFIED EXAMPLE

Figure 10:
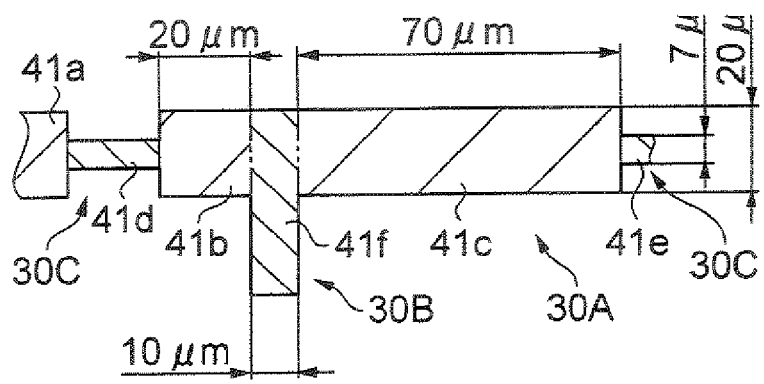
FIG. 10 is an illustration showing the sub-regional division of the design pattern of the gate wiring in a first modified example.

FIG. 10 is an illustration showing the sub-regional division of the design pattern of the gate wiring in a first modified example. Hereafter, descriptions of the parts overlapping the previous embodiment are omitted, and differences of the first modified example from the previous embodiment will mainly be described.

As shown in FIG. 10, sub regions 41a, 41b, and 41c that belong to the sub regions of the A group, and sub regions 41d, 41e, and 41f that belong to the sub regions of the B group, are configured in the first modified example Here, the sub region 41f is a sub region regulated so that it has the width of the gate electrode 30B (10 μ), which is configured to extend from the gate electrode portion 30B to the part of the wide portion 30A. The sub regions 41b and 41c (41a) that structures the wide portion 30A are the sub regions with different length. Particularly, the sub region 41b is a 20 μm×20 μm quadrate sub region.

As shown in this first modified example, it is not necessary that the region have to be divided into the sub regions at the location where the wide portion 30A and the gate electrode portion 30B border on. What is important is to divide the region into "constant, possible-to-regulate shaped" sub regions; hence their shape can vary.

Moreover, the wide portion 30A does not have to be divided evenly. What is important is to divide the region into sub regions "with the length in which the bulges do not occur", or "the length shorter than the occurrence intervals of the bulges in the dummy pattern"; hence their shape can vary.

Moreover, the quadrate sub region 41b does not have a differentiation of which side is the width and which side is the length. However, even if the liquid substance pattern is formed in quadrates, it is obvious that the pattern can maintain shape stability. Thus, there is no logical reason as to determine that the quadrate is not a "shape having an approximately constant width". That is to say, the "shape having an approximately constant width" according to the embodiments of the invention should also be determined in view of whether or not the pattern can maintain stability when the pattern is formed with such shapes. Quadrates naturally fall under that category.

SECOND MODIFIED EXAMPLE

Figure 11:
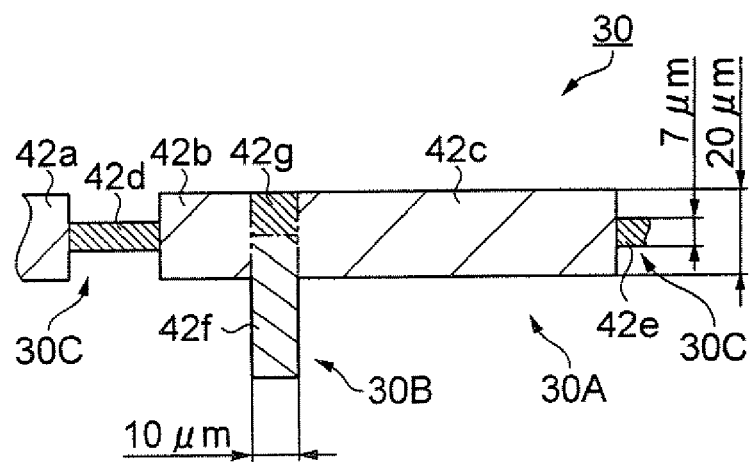
FIG. 11 is an illustration showing the sub-regional division of the design pattern of the gate wiring in a second modified example.

FIG. 11 is an illustration showing the sub-regional division of the design pattern of the gate wiring in a second modified example. Hereafter, descriptions of the parts overlapping the previous embodiments are omitted, and differences of the second modified example from the previous embodiment will mainly be described.

As shown in FIG. 11, sub regions 42a, 42b, and 42c that belong to the sub regions of the A group, sub region 42f that belong to the B group, and sub regions 42d, 42e, and 42g that belong to the sub regions of the C group, are configured in the second modified example.

As mentioned in the second modified example, the number of groups, into which the sub regions are categorized, can be three. In this case, drawing and drying are conducted first on the A group, thereafter on the B group, and finally on the C group. In other words, it does not matter how many groups there will be, yet, the larger the number of groups, the longer the time it takes for the entire process.

Here, in the second modified example, the sub regions 42f and 42g, which are regulated so that they have the width of the gate electrode 30B (10 μm), are configured in a way that they are divided, in the Y-axis direction, from the sub region 41f in the first modified example. As described, the sub regional configuration does not deny the segmentalized division.

THIRD MODIFIED EXAMPLE

Figure 12:
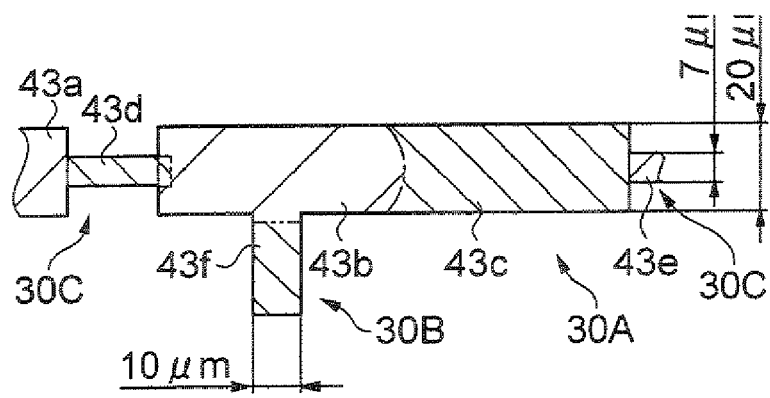
FIG. 12 is an illustration showing the sub-regional division of the design pattern of the gate wiring in a third modified example.
Figure 12:
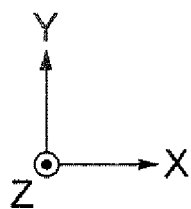

FIG. 12 is an illustration showing the sub-regional division of the design pattern of the gate wiring in a third modified example. Hereafter, descriptions of the parts overlapping the previous embodiment are omitted, and differences of the third modified example from the previous embodiment will mainly be described.

As shown in FIG. 12, sub regions 43a, 43b, and 43e that belong to the A group, and sub regions 43c, 43d, and 43f that belong to the B group, are configured in the third modified example. Here, the sub regions 43b and 43c have a slight step or curvy outline, which cannot be strictly called a rectangular sub region.

The sub regions 43d and 43e regulated to have the width of the narrow portion 30C (7 μm), can belong to different groups, as in the third modified example. Moreover, the shapes of the sub regions 43b and 43c, which cannot be strictly called rectangular, are also included in a "shape having an approximately constant width" according to the embodiments of the invention as long as they can be objectively regulated so that it has a constant width (in this case, 20 μm).

FORTH MODIFIED EXAMPLE

Figure 13:
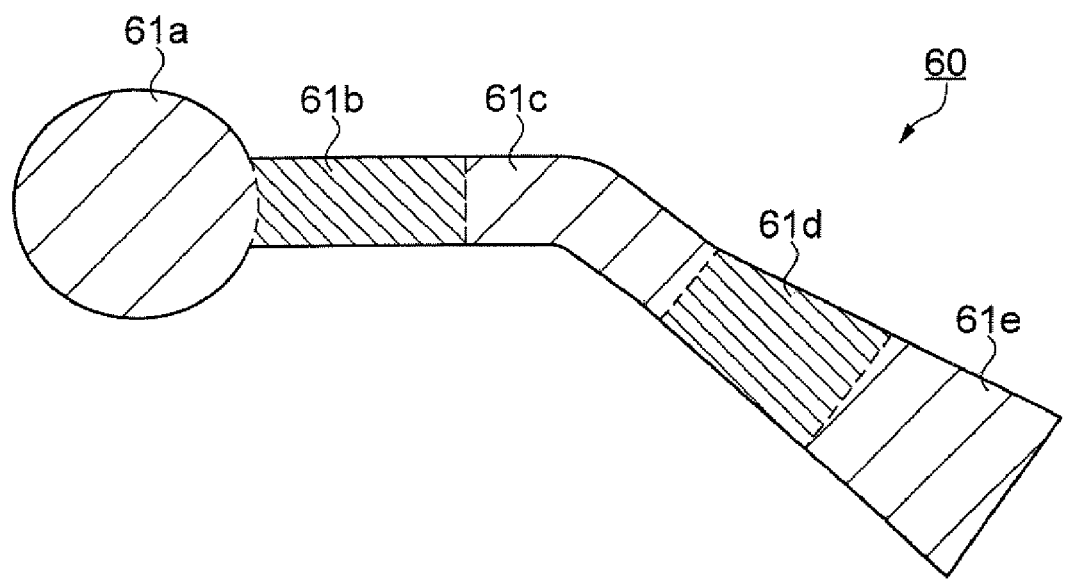
FIG. 13 is an illustration showing the sub-regional division of the design pattern of an electrode wiring in a forth modified example.

FIG. 13 is an illustration showing the sub-regional division of the design pattern of the gate wiring in a forth modified example. Hereafter, descriptions of the parts overlapping the previous embodiments are omitted, and differences of the forth modified example from the previous embodiments will be mainly described.

As shown in FIG. 13, a design pattern 60 includes a circular sub region 61a, a bended belt-shaped sub region 61c, and a trapezoid sub region 61e, as the A group. Moreover, it includes an approximately rectangular sub region 61b and a trapezoid sub region 61d as the B group.

The circular sub region 61a, when its diameter is considered as a width, can be presumed to be regulated so that it has a constant width in the rotation direction with is center as a rotation axis. Moreover, similar to the case of quadrates, even the liquid substance pattern is formed in a circular shape, it is obvious that the pattern can maintain the shape stability. Therefore, the "constant, possible-to-regulate shape" means a shape that can be regulated so that it has a constant width (diameter) in a translation or in one rotation direction, and the circular shapes fall under the category of the "shape having an approximately constant width" according to the embodiments of the invention. Further, the bended belt-shape such as the sub region 61c, or trapezoid of which the length difference of the upper base and the lower base is small, such as the sub regions 61d and 61e, also fall under the category of the "shape having an approximately constant width" according to the embodiments of the invention.

FIFTH MODIFIED EXAMPLE

Figure 14:
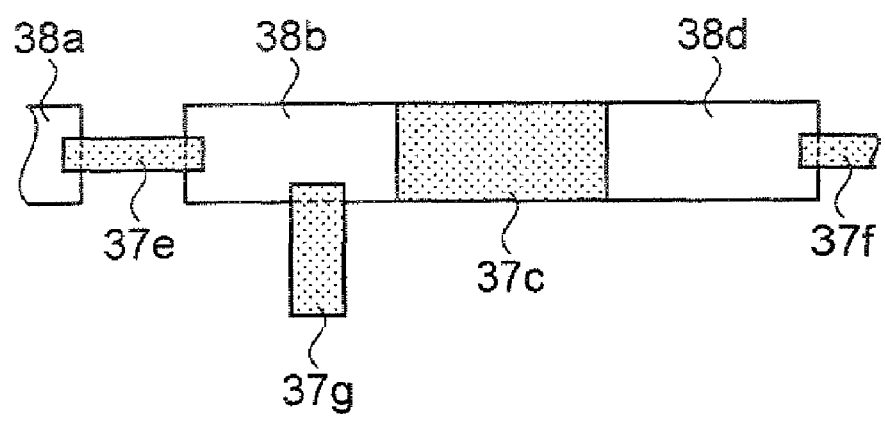
FIG. 14 is a top view illustration showing the liquid substance pattern formed in the second drawing process in a fifth modified example.
Figure 14:
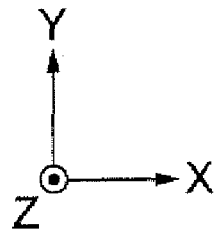

FIG. 14 is a top view illustration showing the liquid substance pattern formed in the second drawing process in a fifth modified example. Hereafter, descriptions of the parts overlapping the previous embodiments are omitted, and differences of the fifth modified example from the previous embodiment will mainly be described.

In the fifth modified example, sub regions 40c, 40e, 40f, and 40g that belong to the B group (refer to FIGS. 5 and 6) are not drawn, in the second drawing process, in their target size. Rather, the patterns are formed so that some parts of those sub regions overlap with the pre-formed wiring films 38a, 38b, and 38d. In other words, the liquid substance patterns 37e, 37f, and 37g have the same width as the corresponding sub regions 40e, 40f and 40f (FIGS. 5 and 6), and are formed slightly longer in the direction of their long sides.

As described in the fifth modified example, the liquid substance pattern does not necessarily need to be formed strictly according to the configured sub regions, and it can also be formed so that parts of sub regions overlap with those of another group.

The invention shall not be limited to the above-mentioned embodiments. That is to say, for instance, when the design pattern is constructed with regions that have various widths, those regions do not necessarily be divided, as long as the shape and film thickness distribution are stable within those ranges. Moreover, each structure of each embodiment may be appropriately combined with each other, omitted, or combined with other structures (not shown).

What is claimed is:

1. A method comprising:
   forming a gate wiring in a predetermined pattern by droplet discharging a plurality of droplets of a conductive material, formation of the gate wiring including:
   dividing the predetermined pattern of the gate wiring into a plurality of sub regions,
   categorizing the plurality of sub regions into at least a first group and a second group, the sub regions being categorized into different groups such that the sub regions categorized into the first group each have a width that is approximately equal, and the sub regions categorized into the second group each have a width that is approximately equal, the widths of the sub regions in the first group being different than the widths of the sub regions in the second group, and the sub regions of the first group being directly connected to the sub regions of the second group;
   discharging the conductive material so as to dispose at least one sub region that belongs to the first group; and
   discharging the conductive material so as to dispose at least one sub region that belongs to the second group;
   wherein the conductive material discharged to form the at least one sub region that belongs to the first group is solidified before the conductive material is discharged to form the at least one sub region that belongs to the second group.

2. The method according to claim 1, wherein sub regions having comparable widths are categorized to the same group.

3. The method according to claim 1, wherein:
   the design pattern of the gate wiring includes an extended region that extends relative to the sub regions;
   the sub regions are configured along a direction in which the extended region extends to segment the extended region at a certain prescribed length; and
   the prescribed length is equal to one interval between protruding portions which emerge in approximately even intervals in the predetermined pattern, formed if a second conductive material is discharged to draw a stripe-shaped pattern with the same width as the extended region.

4. The method according to claim 3, further comprising:
   a step of forming a dummy pattern, which is performed prior to the step of configuring the sub regions, by arranging the second conductive material on a dummy substrate to draw the stripe-shaped pattern with the same width as the extended region;
   wherein the prescribed length is regulated by intervals between the protruding portions which emerge in approximately even intervals in the dummy pattern.

5. The method according to claim 1, wherein a surface of the substrate is subjected liquid-repellent processing or a bank is formed on the surface of the substrate in a manner that surrounds a region corresponding to the design pattern of the gate wiring.

\* \* \* \* \*